(12) United States Patent
Li et al.

(10) Patent No.: US 11,828,959 B2
(45) Date of Patent: Nov. 28, 2023

(54) GRATING STRUCTURE, MANUFACTURING METHOD THEREOF AND DISPLAY DEVICE

(71) Applicant: BOE TECHNOLOGY GROUP CO., LTD., Beijing (CN)

(72) Inventors: Wusheng Li, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 584 days.

(21) Appl. No.: 16/660,386

(22) Filed: Oct. 22, 2019

(65) Prior Publication Data
US 2020/0142108 A1 May 7, 2020

(30) Foreign Application Priority Data

Nov. 2, 2018 (CN) .......................... 201811299690.X

(51) Int. Cl.
*G02B 5/18* (2006.01)
*G02B 30/27* (2020.01)
(Continued)

(52) U.S. Cl.
CPC ........... *G02B 5/1857* (2013.01); *G02B 30/27* (2020.01); *G03F 7/0005* (2013.01);
(Continued)

(58) Field of Classification Search
CPC ..... G02B 5/1857; G02B 30/27; G03F 7/0005; G03F 7/2051; G03F 7/40; G03F 7/70291
See application file for complete search history.

(56) References Cited

U.S. PATENT DOCUMENTS 4,839,250 A * 6/1989 Cowan ................. G03H 1/0248
430/394
2011/0070547 A1* 3/2011 Freese ....................... G03F 7/24
430/325
(Continued)

FOREIGN PATENT DOCUMENTS

CN 1564053 A 1/2005
CN 1564084 A 1/2005
(Continued)

OTHER PUBLICATIONS

English machine translation of CN-103855251-A (Jun. 2014) (Year: 2014).*
(Continued)

*Primary Examiner* — Peter L Vajda
*Assistant Examiner* — Jayson D Cosgrove
(74) *Attorney, Agent, or Firm* — BROOKS KUSHMAN P.C.

(57) ABSTRACT

A grating structure, a manufacturing method thereof and a display device are provided. The method of manufacturing the grating structure includes: forming a photosensitive material layer on a substrate; patterning the photosensitive material layer to form a grating transition pattern, where the grating transition pattern includes multiple grating units, the multiple grating units each include a first portion and a second portion which are symmetric, and at least one of the first portion and the second portion includes multiple sub-units to have a stepped structure; and curing the grating transition pattern to form the grating structure.

15 Claims, 3 Drawing Sheets

(51) Int. Cl.
*G03F 7/20* (2006.01)
*G03F 7/00* (2006.01)
*G03F 7/40* (2006.01)

(52) U.S. Cl.
CPC .............. *G03F 7/2051* (2013.01); *G03F 7/40* (2013.01); *G03F 7/70291* (2013.01)

(56) References Cited

U.S. PATENT DOCUMENTS

| | | | |
|---|---|---|---|
| 2013/0088704 A1* | 4/2013 | Mei | G03F 7/20 355/72 |
| 2017/0075215 A1* | 3/2017 | Lee | G02F 1/1368 |
| 2017/0100903 A1 | 4/2017 | Rodriguez et al. | |
| 2017/0307887 A1* | 10/2017 | Stenberg | G02B 26/0808 |
| 2018/0031744 A1* | 2/2018 | Miller | G02B 5/1814 |
| 2018/0052501 A1* | 2/2018 | Jones, Jr. | G06F 3/013 |

FOREIGN PATENT DOCUMENTS

| | | | |
|---|---|---|---|
| CN | 101320222 A | | 12/2008 |
| CN | 102654591 A | | 9/2012 |
| CN | 103855251 A | * | 6/2014 |
| CN | 103855251 A | | 6/2014 |
| CN | 104597620 A | | 5/2015 |
| CN | 108136667 A | | 6/2018 |
| DE | 102012104900 A1 | * | 12/2012 ....... B29D 11/00769 |

OTHER PUBLICATIONS

English machine translation of DE-102012104900-A1 (Dec. 2012) (Year: 2012).*
First Office Action for Chinese Application No. 201811299690.x, dated Aug. 3, 2020, 9 Pages.
Second Office Action for Chinese Application No. 201811299690.X, dated Apr. 9, 2021, 8 Pages.

* cited by examiner

GRATING STRUCTURE, MANUFACTURING METHOD THEREOF AND DISPLAY DEVICE

CROSS-REFERENCE TO RELATED APPLICATION

This application claims priority to Chinese Patent Application No. 201811299690.X filed in China on Nov. 2, 2018, which is incorporated herein by reference in its entirety.

TECHNICAL FIELD

The present disclosure relates to the field of display technologies, and in particular to a grating structure, a manufacturing method thereof, and a display device.

BACKGROUND

With the continuous developing of display technology, 3D display technology has gained more and more applications. Currently, implementations of 3D display technology mainly include naked-eye 3D display and glass-type 3D display. The principle of the naked-eye 3D display is described as follows. A display panel is provided with a grating structure. Light emitted by left-eye pixels in the display panel corresponding to a left eye of a viewer is directed to the left eye of the viewer, and light emitted by right-eye pixels in the display panel corresponding to a right eye of the viewer is directed to the right eye of the viewer. A left eye image and a right eye image are merged through the visual cortex of the human brain to produce a stereoscopic display effect.

The 3D display effect is associated with the accuracy of the grating structure. However, the accuracy of the grating structure manufactured in the related technologies is low, which adversely affects the 3D display effect.

SUMMARY

An aspect of the present disclosure provides a method of manufacturing a grating structure, including:
  forming a photosensitive material layer on a substrate;
  patterning the photosensitive material layer to form a grating transition pattern, where the grating transition pattern includes multiple grating units, the multiple grating units each include a first portion and a second portion, the first portion and the second portion are symmetric, and at least one of the first portion and the second portion includes multiple subunits to have a stepped structure; and
  curing the grating transition pattern to form the grating structure.

In some embodiments, thicknesses of the multiple subunits are successively reduced in a direction perpendicular to the substrate and away from the substrate.

In some embodiments, patterning the photosensitive material layer to form the pattern transition pattern includes:
  manufacturing the multiple subunits of the grating unit with a digital photolithography technology.

In some embodiments, in a case that the photosensitive material layer is formed by a positive photosensitive material, manufacturing the multiple subunits with the digital photolithography technology includes:
  performing an autofocus operation with an autofocus module in a digital exposure machine according to positions for forming the multiple subunits in the photosensitive material layer, to cause an exposure focal plane corresponding to the multiple subunits to be located in the photosensitive material layer;
  forming, with an exposure module in the digital exposure machine according to mask pattern data corresponding to the multiple subunits, a digital mask pattern corresponding to the mask pattern data, and projecting the digital mask pattern onto the photosensitive material layer; and
  performing exposure on the photosensitive material layer based on the digital mask pattern, to cause the photosensitive material layer located in a depth of focus of the exposure focal plane to be decomposed by light to form the multiple subunits.

In some embodiments, in a case that the photosensitive material layer is formed by a negative photosensitive material, manufacturing the multiple subunits with the digital photolithography technology includes:
  performing an autofocus operation with an autofocus module in a digital exposure machine according to positions for forming the multiple subunits in the photosensitive material layer, to cause an exposure focal plane corresponding to the multiple subunits to be located in the photosensitive material layer;
  forming, with an exposure module in the digital exposure machine according to mask pattern data corresponding to the multiple subunits, a digital mask pattern corresponding to the mask pattern data, and projecting the digital mask pattern onto the photosensitive material layer; and
  performing exposure on the photosensitive material layer located in a depth of focus of the exposure focal plane based on the digital mask pattern; and
  performing development on the exposed photosensitive material layer to form the multiple subunits.

In some embodiments, the exposure module includes a light source, a digital micromirror device, and a projection device, and forming, with the exposure module in the digital exposure machine, the digital mask pattern corresponding to the mask pattern data includes:
  dividing an imaging period into multiple time segments having different time lengths, according to the number of gray levels in the digital mask pattern;
  controlling, according to the mask pattern data, an operation state of each of micromirror units in the digital micromirror device in each of the multiple time segments, where the operation state includes an on state and an off state, and in the on state, the micromirror unit is configured to reflect incident light emitted from the light source to the projection device to form a digital light pulse; and
  superimposing the digital light pulses generated in the imaging period by each of the micromirror units in the digital micromirror device, so as to generate the digital mask pattern.

In some embodiments, the exposure module includes a light source, a digital micromirror device, and a projection device, and forming, with the exposure module in the digital exposure machine, the digital mask pattern corresponding to the mask pattern data includes:
  dividing an imaging period into successive subframes, according to the number of gray levels in the digital mask pattern;
  controlling, according to the mask pattern data, an operation state of each of micromirror units in the digital micromirror device in each subframe, where the operation state includes an on state and an off state, and in the on state, the micromirror unit is configured to reflect incident light emitted from the light source to the projection device to form a subframe image; and superimposing grayscale of all subframe images in the imaging period corresponding to each of the micromirror units in the digital micromirror device, so as to generate the digital mask pattern.

In some embodiments, the subunit, which is farthest from the substrate, in the grating unit has a width in a range from 0.35 μm to 0.5 μm in a direction perpendicular to an extension direction of the subunit.

In some embodiments, the subunits in the grating unit each have a thickness in a range from 0.5 μm to 0.9 μm in a direction perpendicular to the substrate.

In some embodiments, forming the photosensitive material layer on the substrate includes: forming the photosensitive material layer by coating a photosensitive resin material on the substrate.

In some embodiments, curing the grating transition pattern to form the grating structure includes: curing the grating transition pattern to make a surface of each of the multiple grating units facing away from the substrate become smooth to approach an arc shape.

Based on the technical solution of the method of manufacturing the grating structure described above, another aspect of the present disclosure provides a grating structure manufactured with the above-mentioned method of manufacturing the grating structure.

Based on the technical solution of the method of manufacturing the grating structure described above, a still another aspect of the present disclosure provides a display device including the above-mentioned grating structure.

BRIEF DESCRIPTION OF THE DRAWINGS

The accompanying drawings are used to provide a further understanding of the present disclosure and form a part of the present disclosure. The exemplary embodiments of the present disclosure and the descriptions thereof are merely intended to explain the present disclosure, and do not intend to limit the present disclosure. In the drawing.

DETAILED DESCRIPTION

Hereinafter, a detailed description will be provided in conjunction with the drawings, so as to further explain a grating structure, a manufacturing method thereof and a display device according to embodiments of the present disclosure.

To address the issue in the related technologies that the grating structure has low precision and thus affecting the 3D display effect, the present disclosure provides a grating structure, a manufacturing method thereof and a display device.

Figure 1:
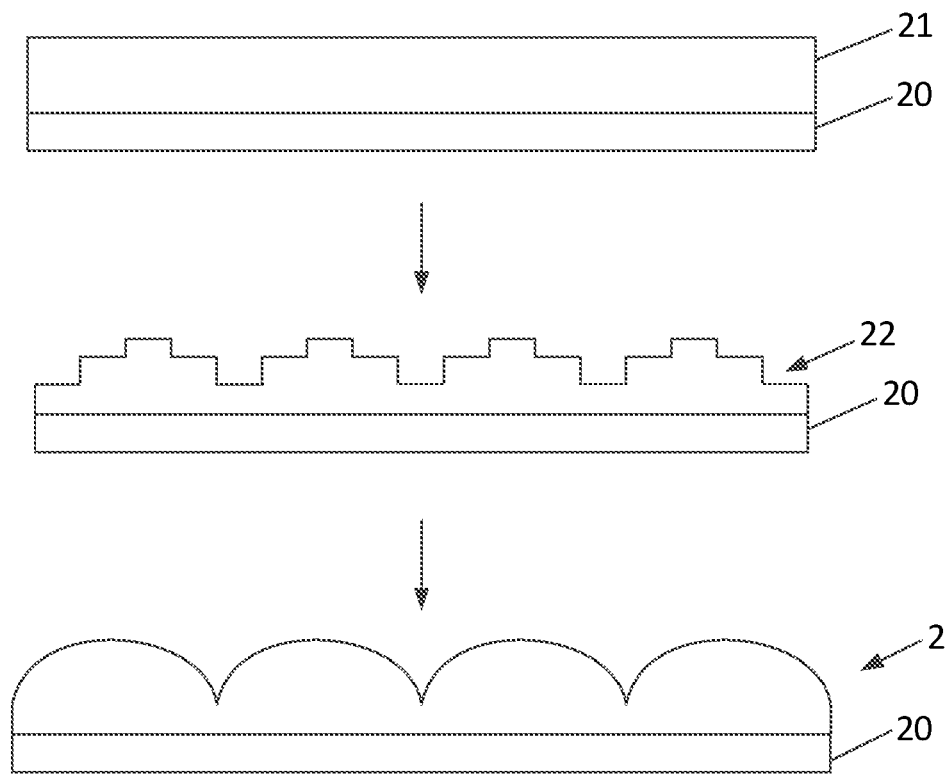
FIG. 1 is a schematic diagram of a process of manufacturing a grating structure according to some embodiments of the present disclosure.
Figure 2:
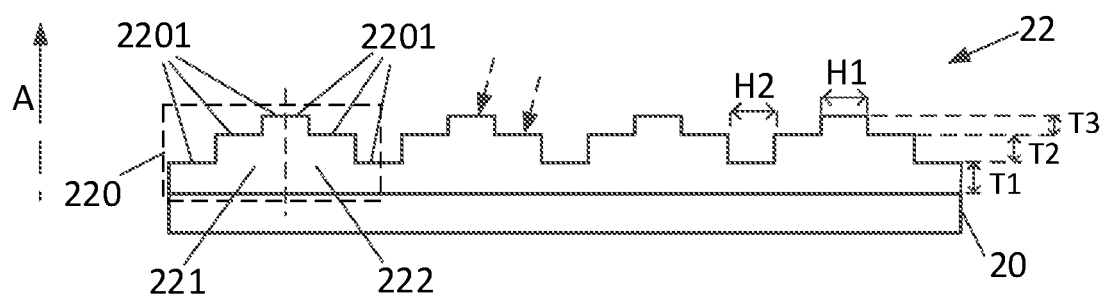
FIG. 2 is a schematic structural diagram of a grating transition pattern according to some embodiments of the present disclosure.

Referring to FIG. 1 and FIG. 2, a method of manufacturing a grating structure is provided in accordance with embodiments of the present disclosure, and the method includes steps 101 to 103.

In step 101, a photosensitive material layer 21 is formed on a substrate 20. In some embodiments, a photosensitive resin material may be coated on the substrate 20 to form the photosensitive material layer 21, but the embodiments are not limited thereto.

In step 102, the photosensitive material layer 21 is patterned to form a grating transition pattern 22, where the grating transition pattern 22 includes multiple grating units 220. The grating unit 220 includes a first portion 221 and a second portion 222 which are symmetric, and the first portion 221 has a stepped structure including multiple subunits 2201. In some embodiments, thicknesses of the multiple subunits 2201 may be successively reduced (i.e., thicknesses T1, T2 and T3 as illustrated in FIG. 2 may be successively reduced) in a direction (i.e., direction A as illustrated in FIG. 2) perpendicular to the substrate 20 and away from the substrate 20.

Specifically, after the photosensitive material layer 21 is formed, the photosensitive material layer 21 may be patterned by a patterning process, so as to form the grating transition pattern 22 including the multiple grating units 220. The grating unit 220 may include a first portion 221 and a second portion 222 symmetric to each other, and the two portions each include multiple subunits 2201 forming a stepped structure. The thicknesses of the multiple subunits 2201 successively decrease in the direction away from the substrate 20, to form the grating transition pattern 22 having such a structure where each of the grating units 220 is formed to be a symmetric structure, and a surface of each of the grating units 220 facing away from the substrate 20 is relatively smooth and is approximately of an arc shape.

In some embodiments, the thicknesses of the multiple subunits 2201 may be successively increased in the direction perpendicular to the substrate 20 and away from the substrate 20; or, in some embodiments, the subunits 2201 with large thicknesses and the subunits 2201 with small thicknesses may be alternately arranged in the direction perpendicular to the substrate 20 and away from the substrate 20; and the present disclosure is not limited thereto, as long as the surface of each of the grating units 220 facing away from the substrate 20 is relatively smooth and is approximately of an arc shape.

In step 103, the grating transition pattern 22 is cured to form the grating structure 2. Specifically, after the photosensitive material layer 21 is patterned to form the grating transition pattern 22, the subunits 2201, which are included in each of the grating units 220 of the grating transition pattern 22, still have sharp edge angles. The photosensitive material layer 21 forming the grating transition pattern 22 is placed in an environment having a temperature of, for example, 100 to 250 degrees Celsius, to be cured for, for example, about 1 hour. In such manner, the edge angles of the subunits 2201 in the grating unit 220 become smooth, and the grating structure 2 with high precision is formed.

When adopting the method in accordance with the embodiments of the present disclosure to manufacture the grating structure 2, the photosensitive material layer 21 is formed, and then the photosensitive material layer 21 is patterned to form the grating transition pattern 22. The grating transition pattern 22 includes the multiple grating units 220, the grating units each are of a symmetric stepped structure, and the thicknesses of the multiple subunits 2201 in the stepped structure successively decrease in the direction away from the substrate 20, hence, when the grating structure 2 is formed after curing the grating transition pattern 22, the grating unit 220 in the grating structure 2 can be formed as a standard symmetric structure, and a surface of the grating unit 220 facing away from the substrate 20 is relatively smooth and is approximately of an arc shape. Therefore, the manufactured grating structure 2 has a high precision when the method in accordance with the embodiments of the present disclosure is adopted to manufacture the grating structure 2, and a better 3D display effect can be ensured when such grating structure 2 is applied to a 3D display device.

In some embodiments, patterning the photosensitive material layer 21 to form the pattern transition pattern 22 in the step 102 may include:

manufacturing the multiple subunits 2201 of the grating unit 220 with a digital photolithography technology.

Specifically, in patterning the photosensitive material layer 21 to form the grating transition pattern 22, the patterning process in the related technologies may be used, that is, exposure is performed on the photosensitive material layer 21 with a physical mask, and development is then performed on the exposed photosensitive material layer 21 to obtain the grating transition pattern 22. However, this patterning process has the following disadvantages.

1. In a case that a display panel in a 3D display device adopts a liquid crystal display panel, the production line in the related technologies cannot be compatible with the device for manufacturing the liquid crystal display panel and the device for manufacturing the grating structure 2 in the related technologies.
2. A large error will occur when small-sized grating units 220 are manufactured by the patterning process in the related technologies.

Figure 3:
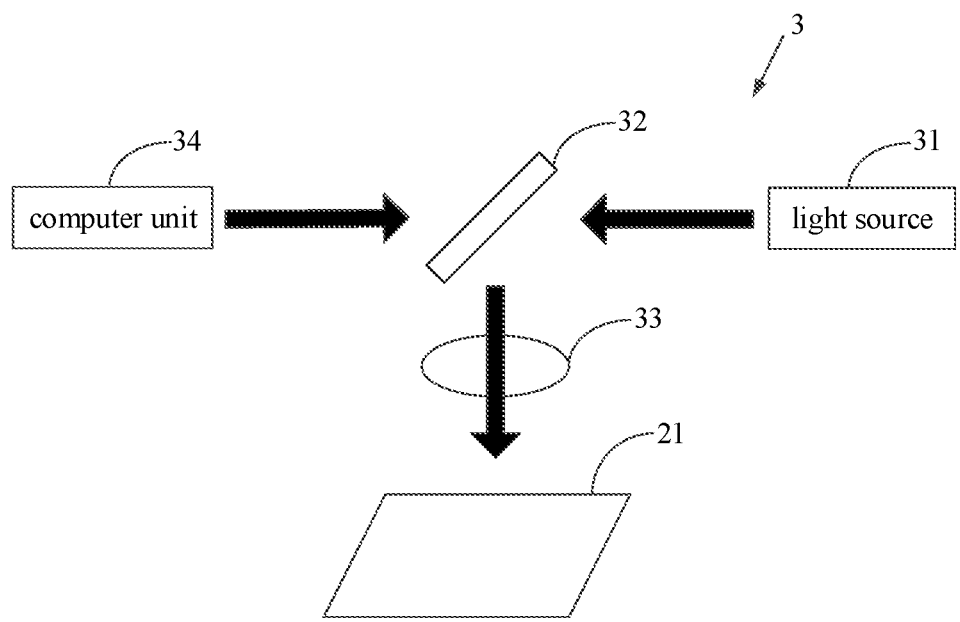
FIG. 3 is a schematic structural diagram of a digital exposure machine according to some embodiments of the present disclosure.

As shown in FIG. 3, in patterning the photosensitive material layer 21 by the digital photolithography technology to form the grating transition pattern 22, a digital mask pattern may be formed on the photosensitive material layer 21 with a digital exposure machine 3. The digital photolithography on the photosensitive material layer 21 is realized with the digital mask pattern. The digital exposure machine 3 is not only compatible with the device for manufacturing the liquid crystal display panel, but also achieves a resolution of submicron order (0.7 micrometers (μm)). A relatively small error is caused when manufacturing the grating units 220 having small dimensions.

In some embodiments, in a case that photosensitive material layer 21 is formed by a positive photosensitive material, manufacturing the multiple subunits 2201 with the digital photolithography technology may include steps 1021 to 1023.

In step 1021, an autofocus operation is performed, according to positions for forming the multiple subunits 2201 in the photosensitive material layer 21, with an autofocus module in a digital exposure machine 3, to make an exposure focal plane (the dotted arrows in FIG. 2 denotes the exposure focal plane corresponding to the subunits) corresponding to the multiple subunits 2201 to be located in the photosensitive material layer 21. Specifically, in performing exposure on the photosensitive material layer 21 with the digital exposure machine 3, autofocus operation is performed by the autofocus module in the digital exposure machine 3, to make a position of a digital mask pattern projected by the exposure module in the digital exposure machine 3 to be coincident with a position where the to-be-manufactured subunits 2201 will be formed in the photosensitive material layer 21. The exposure focal plane corresponding to the subunits 2201 is formed on the photosensitive material layer 21. It should be noted that the autofocus module in the digital exposure machine 3 may be integrated with the projection device 33, as shown in FIG. 3.

In step 1022, the digital mask pattern corresponding to the mask pattern data is formed with the exposure module in the digital exposure machine 3 according to the mask pattern data corresponding to the subunits 2201, and the digital mask pattern is projected onto the photosensitive material layer 21. In some embodiments, the mask pattern data corresponding to the subunits 2201 includes information of a mask pattern to be utilized for forming the subunits 2201, and the information of the mask pattern may be pre-stored in a computer unit 34 of the digital exposure machine 3. The exposure module in the digital exposure machine 3 performs modulation on an incident light based on the information of the mask pattern to form the corresponding digital mask pattern, and projects the digital mask pattern onto the photosensitive material layer 21.

In step 1023, exposure is performed on the digital mask pattern, to cause the photosensitive material layer 21 located in a depth of focus of the exposure focal plane to be decomposed by light to form the subunits 2201.

Specifically, after projecting the formed digital mask pattern onto the photosensitive material layer 21 by the exposure module in the digital exposure machine 3, exposure may be directly performed on the photosensitive material layer 21 with the digital mask pattern. Since the photosensitive material in the photosensitive material layer 21 is the positive photosensitive material, the photosensitive material layer 21, which is in the range of the depth of focus of the exposure focal plane corresponding to the subunits 2201, is directly decomposed by light to form the corresponding subunits 2201.

In the foregoing method of forming the photosensitive material layer 21 with the positive photosensitive material, and performing photolithography on the photosensitive material layer 21 by the digital exposure machine 3, the cost, period and complexity of manufacturing the mask are reduced to a great extent by substituting the digital mask pattern formed by the digital exposure machine 3 for the mask of the photolithography in the related technologies, which also increases the application flexibility. Moreover, a development process is not required in the method, such that the formation process of the subunits 2201 is simpler.

In some embodiments, in a case that photosensitive material layer 21 is formed by a negative photosensitive material, manufacturing the multiple subunits 2201 with the digital photolithography technology may include steps 1021' to 1024'.

In step 1021', an autofocus operation is performed according to positions for forming multiple subunits 2201 in the photosensitive material layer 21 with an autofocus module in a digital exposure machine 3, to cause an exposure focal plane (the dotted arrows in FIG. 2 denotes the exposure focal plane corresponding to the subunits) corresponding to the multiple subunits 2201 to be located in the photosensitive material layer 21. Specifically, in performing exposure on the photosensitive material layer 21 with the digital exposure machine 3, an autofocus operation is performed with the autofocus module in the digital exposure machine 3, to cause a position of the digital mask pattern projected by the exposure module in the digital exposure machine 3 to be coincident with a position where the to-be-manufactured subunits 2201 will be formed in the photosensitive material layer 21. The exposure focal plane corresponding to the subunits 2201 is formed on the photosensitive material layer 21.

In step 1022', a digital mask pattern corresponding to mask pattern data is formed with the exposure module in the digital exposure machine 3 according to the mask pattern data corresponding to the multiple subunits 2201, and the digital mask pattern is projected onto the photosensitive material layer 21. In some embodiments, the mask pattern data corresponding to the subunits 2201 includes information of a mask pattern to be utilized for forming the subunits 2201, and the information of the mask pattern may be pre-stored in a computer unit 34 of the digital exposure machine 3. The exposure module in the digital exposure machine 3 performs modulation on an incident light based on the information of the mask pattern to form the digital mask pattern, and projects the digital mask pattern onto the photosensitive material layer 21.

In step 1023', exposure is performed on the photosensitive material layer 21 located in a depth of focus of the exposure focal plane with the digital mask pattern. Specifically, after the formed digital mask pattern is projected onto the photosensitive material layer 21 with the exposure module in the digital exposure machine 3, exposure may be directly performed on the photosensitive material layer 21 located in the depth of focus of the exposure focal plane by utilizing the digital mask pattern.

In step 1024', development is performed on the photosensitive material layer 21 after exposure to form the multiple subunits 2201. Specifically, after exposure is performed on the photosensitive material layer 21, the exposed photosensitive material layer 21 may be developed with a developer liquid to form the subunits 2201.

In the foregoing method of forming the photosensitive material layer 21 with the negative photosensitive material, and performing photolithography on the photosensitive material layer 21 with the digital exposure machine 3, the cost, period and complexity of manufacturing the mask are reduced to a great extent by substituting the digital mask pattern formed by the digital exposure machine 3 for the mask of the photolithography in the related technologies, which also increases the application flexibility.

As shown in FIG. 3, the foregoing exposure module in the digital exposure machine 3 may include a light source 31, a digital micromirror device 32, and a projection device 33. The general operation process of the exposure module is as follows. Incident light emitted by the light source 31 is transmitted to the digital micromirror device 32. The digital micromirror device 32 operates, under the control of the computer unit 34 in the digital exposure machine 3, in a corresponding operation state based on the mask pattern data, such that modulation on the incident light is achieved. The modulated incident light is transmitted to the projection device 33 and projected onto the photosensitive material layer 21 via the projection device 33 to form a corresponding digital mask pattern. In some embodiments, the exposure module may further include a collimating lens structure between the light source 31 and the digital micromirror device 32. The collimating lens structure is for more accurately transmitting the light emitted by the light source 31 to the digital micromirror device 32.

When the exposure module includes the foregoing structures, forming the digital mask pattern corresponding to the mask pattern data with the exposure module in the digital exposure machine 3 in the above steps 1022 and 1022' may be implemented by adopting a binary pulse width modulation on the incident light, details of which are described as follows.

An imaging period is divided into multiple time segments having different time lengths according to the number of gray levels in the digital mask pattern. Specifically, in an example where the number of gray levels in the digital mask pattern is 8, the imaging period may be divided into three time segments having different time lengths, each time segment may correspond to two states, and $2^3$ kinds of different grayscale effects can be implemented.

An operation state of each of micromirror units in the digital micromirror device 32 in each of the time segments is controlled according to the mask pattern data. The operation state includes an on state and an off state. In the on state, the micromirror unit is configured to reflect incident light emitted from the light source 31 to the projection device 33 to form a digital light pulse. Specifically, the digital micromirror device 32 includes multiple micromirror units arranged in an array, each micromirror unit may be independently controlled and may be quickly switched between the on state and the off state. When the micromirror unit is in the on state, the incident light emitted by the light source 31 may be reflected by the micromirror unit to an aperture of the projection device 33 (for example, a projection lens), so as to generate a beam of digital light pulse. When the micromirror unit is in the off state, the micromirror unit will not reflect the incident light emitted by the light source 31 to the projection device 33. It should be noted that the micromirror unit may have a switching speed of 10 μs and an on-state time ratio of 92%.

The digital light pulses generated in the imaging period by each of the multiple micromirror units in the digital micromirror device are superimposed to generate the digital mask pattern. Specifically, in an imaging period, multiple beams of digital light pulses corresponding to the micromirror unit may be generated by controlling the on or off state of the micromirror unit. The multiple beams of digital light pulses are superimposed to obtain a corresponding grayscale image formed in the imaging period by the micromirror unit. The grayscale images formed by all the micromirror units may be stitched together as the digital mask pattern.

Figure 4:
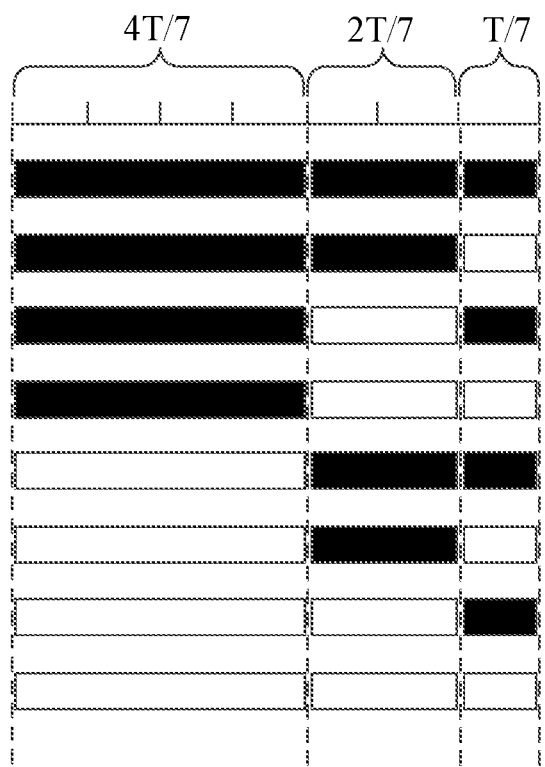
FIG. 4 is a schematic diagram of modulation on incident light performed by an exposure module according to some embodiments of the present disclosure.

More specifically, a case where the number of gray levels in the digital mask pattern is equal to 8 is taken as an example, an imaging period T, i.e., a display duration of one frame, may be divided into three time segments having different time lengths: T/7, 2T/7 and 4T/7. As shown in FIG. 4, eight kinds of gray scales may be achieved by controlling the on or off state of the micromirror unit in the three time segments. Exemplarily, the micromirror unit may be controlled to be in the off state during all time segments of T/7, 2T/7 and 4T/7, as a state shown in the first row in FIG. 4. Or, the micromirror unit may be controlled to be in the on state during T/7, and to be in the off state during both 2T/7 and 4T/7, as a state shown in the second row in FIG. 4.

In some other embodiments, forming the digital mask pattern corresponding to mask pattern data with the exposure module in the digital exposure machine 3 in the foregoing steps 1022 and 1022' may further include the following.

Figure 5:
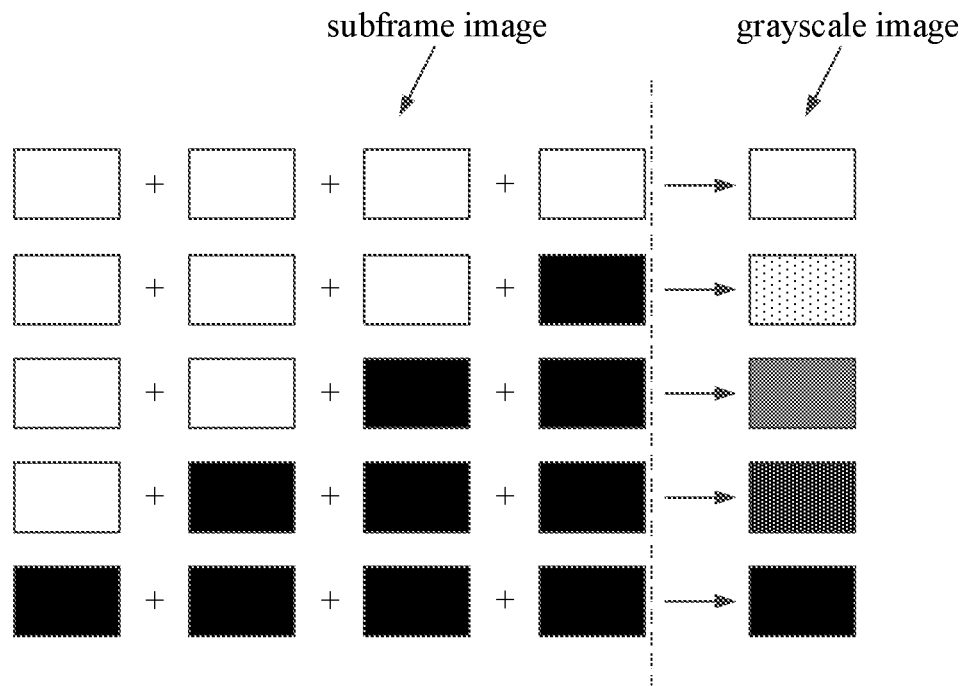
FIG. 5 is a schematic diagram of modulation on incident light performed by an exposure module according to some other embodiments of the present disclosure.

An imaging period is divided into successive subframes according to the number of gray levels in the digital mask pattern. Specifically, as shown in FIG. 5, a case where the number of gray levels in the digital mask pattern is 5 is taken as an example, the imaging period may be divided into four successive subframes, each subframe may correspond to two states, and 5 kinds of grayscale effects can be achieved.

An operation state of each of micromirror units in the digital micromirror device 32 in each subframe is controlled according to the mask pattern data. The operation state includes an on state and an off state. In the on state, the micromirror unit is configured to reflect incident light emitted from the light source 31 to the projection device 33 to form a subframe image.

Specifically, the digital micromirror device 32 includes multiple micromirror units arranged in an array, each micromirror unit may be independently controlled, and may quickly switch between the on state and the off state. In a case that the micromirror unit is in the on state, the incident light emitted by the light source 31 may be reflected by the micromirror unit to an aperture of the projection device 33 (for example, a projection lens), so as to form a corresponding subframe image. In a case that the micromirror unit is in the off state, the micromirror unit will not reflect the incident light emitted by the light source 31 to the projection device 33, and it can be considered that a corresponding subframe image generated in such case is a black image Grayscales of all subframe images, which correspond to each of the multiple micromirror units in the digital micromirror device 32 in the imaging period, are superimposed to generate the digital mask pattern.

In some embodiments, in an imaging period, multiple subframe images corresponding to the micromirror unit may be generated by controlling the on or off state of the micromirror unit. The multiple subframe images are superimposed to obtain a corresponding grayscale image formed in the imaging period by the micromirror unit. The grayscale images formed by all the micromirror units may be stitched together as the digital mask pattern.

More specifically, a case where the number of gray levels in the digital mask pattern is equal to 5 is taken as an example, an imaging period T, i.e., a display duration of one frame, may be divided into four successive subframes. As shown in FIG. 5, 5 kinds of gray scales may be achieved by controlling the on or off state of the micromirror unit in each of the subframes. Exemplarily, the micromirror unit may be controlled to be in the on state in all the four successive subframes, as a state shown in the first row in FIG. 5. Or, the micromirror unit may be controlled to be in the off state in the first subframe, and to be in the on state in the remaining three subframes, as a state shown in the second row in FIG. 5.

The dimensions of the grating units 220 provided in accordance with the foregoing embodiments may be set according to actual demand. Exemplarily, the subunit 2201, which is farthest from the substrate 20, in the grating unit 220 may have a width from 0.35 μm to 0.5 μm in a direction perpendicular to an extension direction of the subunit. That is, the width of two sub-units 2201 in the grating unit 220 which are symmetric to each other and both are farthest from the substrate 20 is between 0.7 μm and 1 μm in a direction perpendicular to the direction in which they extend, as indicated by H1 in FIG. 2. The subunit 2201 in the grating unit 220 has a thickness in a range from 0.5 μm to 0.9 μm in a direction perpendicular to the substrate 20.

More specifically, the first portion 221 and the second portion 222 in the grating unit 220 each include three subunits 2201 is taken as an example, in a direction away from the substrate 20, the three subunits 2201 are sequentially defined as a first subunit, a second subunit, and a third subunit. The thickness of the first subunit in the direction perpendicular to the substrate 20 may be set in a range of 0.7 μm to 0.9 μm. The thickness of the second subunit in the direction perpendicular to the substrate 20 may be set in a range of the 0.6 μm to 0.9 μm. The thickness of the third subunit in the direction perpendicular to the substrate 20 may be set in a range of 0.5 μm to 0.9 μm. Furthermore, a distance between two adjacent second sub-units, as indicated by H2 in FIG. 2, may be set in a range of 0.7 μm to 1 μm.

In some embodiments, the thicknesses of the multiple subunits 2201 may be successively increased in the direction perpendicular to the substrate 20 and away from the substrate 20, for example, the thickness of the first subunit may be set in a range of 0.5 μm to 0.9 μm, the thickness of the second subunit may be set in a range of the 0.6 μm to 0.9 μm, and the thickness of the third subunit may be set in a range of 0.7 μm to 0.9 μm. Or, in some embodiments, the subunits 2201 with large thicknesses and the subunits 2201 with small thicknesses may be alternately arranged in the direction perpendicular to the substrate 20 and away from the substrate 20, for example, the thickness of the first subunit may be set in a range of 0.5 μm to 0.9 μm, the thickness of the second subunit may be set in a range of the 0.6 μm to 0.9 μm, the thickness of the third subunit may be set in a range of 0.5 μm to 0.9 μm, and more specifically, the thickness of the first subunit may be equal to the thickness of the third subunit. The present disclosure is not limited thereto, as long as the surface of each of the grating units 220 facing away from the substrate 20 is relatively smooth and is approximately of an arc shape.

By setting the dimension of the grating unit 220 as above, a surface of the grating unit 220 facing away from the substrate 20 is smooth and approximately has an arc shape. The grating structure 2 has a better precision when the grating structure 2 includes the grating units 220 having the above dimensions, and thus a better 3D display effect can be ensured when the grating structure 2 is applied to a 3D display device.

Some embodiments of the present disclosure further provide a grating structure, which is manufactured by the method of manufacturing the grating structure provided in accordance with the foregoing embodiments.

As shown in FIG. 1 and FIG. 2, in manufacturing the grating structure 2 with the method provided in accordance with the foregoing embodiments, the photosensitive material layer 21 is formed, and then the photosensitive material layer 21 is patterned to form the grating transition pattern 22. The grating transition pattern 22 includes multiple grating units 220, the grating unit is of a symmetric stepped structure, and thicknesses of the multiple subunits 2201 in the stepped structure successively decreases in a direction away from the substrate 20, hence, when the grating structure 2 is formed after curing the grating transition pattern 22, the grating unit 220 in the grating structure 2 can be formed as a standard symmetrical structure, and a surface of the grating unit 220 facing away from the substrate 20 is relatively smooth and is approximately of an arc shape. Therefore, in a case that the manufactured grating structure 2 provided in accordance with the embodiments of the present disclosure is manufactured by the foregoing method, a higher precision can be realized, and a better 3D display effect can be ensured in a case that the grating structure 2 is applied to a 3D display device.

Some embodiments of the present disclosure further provide a display device, including the grating structure 2 provided in accordance with the foregoing embodiments.

Figure 6:
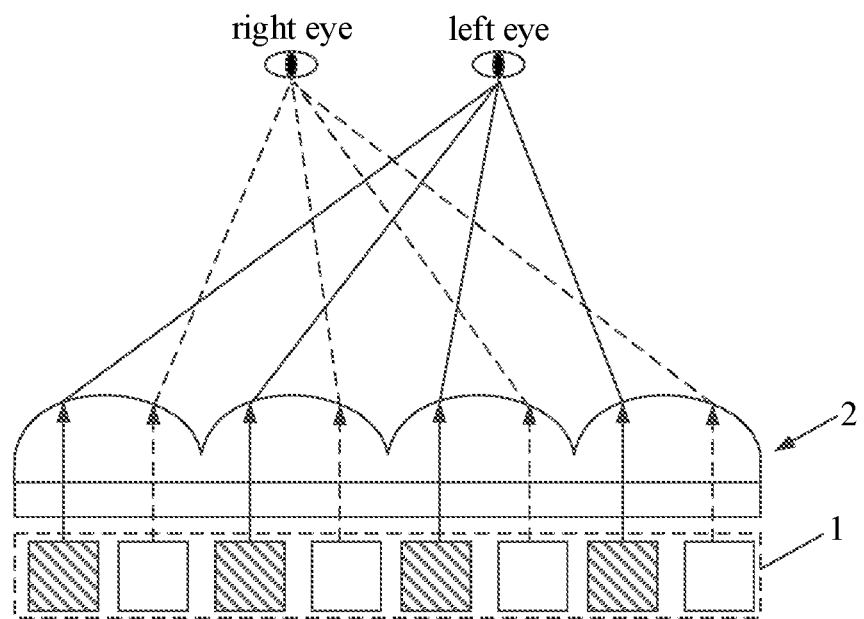
FIG. 6 is a schematic diagram of a display device according to some embodiments of the present disclosure.

As shown in FIG. 6, the display device includes a display panel 1 and a grating structure 2. A left-eye image is displayed by left-eye pixels in the display panel 1 corresponding to a left eye of a viewer, and a right-eye image is displayed by right-eye pixels in the display panel 1 corresponding to a right eye of the viewer. The left eye image enters, via the grating structure 2, a viewing zone of the left eye of the viewer, and the right eye image enters, via the grating structure 2, a viewing zone of the right eye of the viewer. After viewing the left eye image and the right eye image respectively by the left eye and right eye of the viewer, the images are merged by the visual cortex of human brain to produce a stereoscopic display effect.

Since the grating structure 2 provided by the foregoing embodiments has a high precision, a better 3D effect can be realized in a case that the display device provided in accordance with the embodiments of the present disclosure includes the grating structure 2 provided in accordance with the foregoing embodiments.

Unless otherwise defined, technical terms or scientific terms used in the present disclosure shall have common meanings understood by those ordinary skilled in the art. Terms such as "first" and "second" in the present disclosure do not indicate any order, quantity or importance, and they are merely used to distinguish different components. Terms such as "include" or "contain" indicate that an element or object before such terms covers an element, an object or the equivalent enumerated after such terms, and do not exclude other elements and objects. Terms such as "coupled" and "connected" are not used to limit physical or mechanical connection, they may be direct or indirect electrical connection. Terms such as "above", "below", "left" and "right" are merely to describe relative position relationships, and if an absolute position of a described object changes, relative positions with respect to the described object may change correspondingly.

It can be understood that, if an element such as a layer, a film, a region or a substrate is described to be on or below another element, the element may be directly on or below the other element, or there may be an intermediate element between the element and the other element.

Specific features, structures, materials and characteristics in descriptions of the above implementations may be combined properly in one or more embodiments or examples.

The above descriptions merely illustrate some embodiments of the present disclosure, and the protection scope of the present disclosure is not limited thereto. Various modifications and substitutions made by those skilled in the art without departing from the technical scope of the present disclosure shall fall within the protection scope of the present disclosure. Therefore, the protection scope of the present disclosure shall be consistent with the scope defined in the appended claims.

What is claimed is:

1. A method of manufacturing a grating structure for a naked-eye three dimension (3D) display, comprising:
    forming a photosensitive material layer on a substrate;
    forming, with an exposure module in a digital exposure machine according to mask pattern data corresponding to a grating transition pattern, a digital mask pattern corresponding to the mask pattern data, and projecting the digital mask pattern onto the photosensitive material layer; and
    manufacturing, with the digital exposure machine according to the digital mask pattern without using a physical mask, the grating transition pattern;
    wherein the grating transition pattern comprises a plurality of grating units, the plurality of grating units each comprises a first portion and a second portion, the first portion and the second portion are symmetric and directly contacted with each other, and each of the first portion and the second portion comprises a plurality of subunits to have a stepped structure;
    wherein the plurality of subunits comprises a first subunit, a second subunit and a third subunit sequentially arranged in a direction perpendicular to and away from the substrate, the third subunit, which is farthest from the substrate, in each grating unit has a width in a range from 0.35 μm to 0.5 μm in a direction perpendicular to an extension direction of the subunit,
    the third subunit in each grating unit have a thickness in a range from 0.5 μm to 0.9 μm in a direction perpendicular to the substrate, the second subunit in each grating unit have a thickness in a range from 0.6 μm to 0.9 μm in the direction perpendicular to the substrate, the first subunit in each grating unit have a thickness in a range from 0.7 μm to 0.9 μm in the direction perpendicular to the substrate; and
    the thicknesses of the first subunit, the thicknesses of the second subunit and the thicknesses of the third subunit are successively reduced, and
    the method further comprises:
    curing the grating transition pattern to cause a transition from the grating transition pattern to the grating structure, by placing the grating transition pattern in an environment having a temperature in a range of 100 to 250 degrees Celsius for about 1 hour, to cause edge angles for the plurality of subunits to become smooth, such that a surface of each of the plurality of grating units facing away from the substrate become smooth to approach an arc shape, so as to form the grating structure for the naked-eye 3D display having a plurality of arc-shaped grating units;
    wherein an arc-shaped grating unit in the plurality of arc-shaped grating units corresponds to at least one left-eye pixel for displaying a left-eye image and at least one right eye pixel for displaying a right-eye image, such that the left-eye image is enabled to enter a left eye of a viewer, while the right-eye image is enabled to enter a right eye of the viewer.

2. The method of manufacturing the grating structure according to claim 1, wherein in a case that the photosensitive material layer is formed by a positive photosensitive material, the manufacturing, with the digital exposure machine according to the digital mask pattern without using a physical mask, the grating transition pattern comprises:
    performing an autofocus operation with an autofocus module in a digital exposure machine according to positions for forming the plurality of subunits in the photosensitive material layer, to cause an exposure focal plane corresponding to the plurality of subunits to be located in the photosensitive material layer; and
    performing exposure on the photosensitive material layer based on the digital mask pattern, to cause the photosensitive material layer located in a depth of focus of the exposure focal plane to be decomposed by light to form the plurality of subunits.

3. The method of manufacturing the grating structure according to claim 1, wherein in a case that the photosensitive material layer is formed by a negative photosensitive material, the manufacturing, with the digital exposure machine according to the digital mask pattern without using a physical mask, the grating transition pattern comprises:
    performing an autofocus operation with an autofocus module in a digital exposure machine according to positions for forming the plurality of subunits in the photosensitive material layer, to cause an exposure focal plane corresponding to the plurality of subunits to be located in the photosensitive material layer;

performing exposure on the photosensitive material layer located in a depth of focus of the exposure focal plane based on the digital mask pattern; and performing development on the exposed photosensitive material layer to form the plurality of subunits.

4. The method of manufacturing the grating structure according to claim 2, wherein the exposure module comprises a light source, a digital micromirror device, and a projection device, and forming, with the exposure module in the digital exposure machine, the digital mask pattern corresponding to the mask pattern data comprises:

dividing an imaging period into a plurality of time segments having different time lengths, according to the number of gray levels in the digital mask pattern;

controlling, according to the mask pattern data, an operation state of each of micromirror units in the digital micromirror device in each of the plurality of the time segments, wherein the operation state comprises an on state and an off state, and in the on state, the micromirror unit is configured to reflect incident light emitted from the light source to the projection device to form a digital light pulse; and superimposing the digital light pulses generated in the imaging period by each of the micromirror units in the digital micromirror device, so as to generate the digital mask pattern.

5. The method of manufacturing the grating structure according to claim 3, wherein the exposure module comprises a light source, a digital micromirror device, and a projection device, and forming, with the exposure module in the digital exposure machine, the digital mask pattern corresponding to the mask pattern data comprises:

dividing an imaging period into a plurality of time segments having different time lengths, according to the number of gray levels in the digital mask pattern;

controlling, according to the mask pattern data, an operation state of each of micromirror units in the digital micromirror device in each of the plurality of the time segments, wherein the operation state comprises an on state and an off state, and in the on state, the micromirror unit is configured to reflect incident light emitted from the light source to the projection device to form a digital light pulse; and superimposing the digital light pulses generated in the imaging period by each of the micromirror units in the digital micromirror device, so as to generate the digital mask pattern.

6. The method of manufacturing the grating structure according to claim 2, wherein the exposure module comprises a light source, a digital micromirror device, and a projection device, and forming, with the exposure module in the digital exposure machine, the digital mask pattern corresponding to the mask pattern data comprises:

dividing an imaging period into successive subframes according to the number of gray levels in the digital mask pattern;

controlling, according to the mask pattern data, an operation state of each of micromirror units in the digital micromirror device in each subframe, wherein the operation state comprises an on state and an off state, and in the on state, the micromirror unit is configured to reflect incident light emitted from the light source to the projection device to form a subframe image; and superimposing grayscale of all subframe images in the imaging period corresponding to each of the micromirror units in the digital micromirror device, so as to generate the digital mask pattern.

7. The method of manufacturing the grating structure according to claim 3, wherein the exposure module comprises a light source, a digital micromirror device, and a projection device, and forming, with the exposure module in the digital exposure machine, the digital mask pattern corresponding to the mask pattern data comprises:

dividing an imaging period into successive subframes according to the number of gray levels in the digital mask pattern;

controlling, according to the mask pattern data, an operation state of each of micromirror units in the digital micromirror device in each subframe, wherein the operation state comprises an on state and an off state, and in the on state, the micromirror unit is configured to reflect incident light emitted from the light source to the projection device to form a subframe image; and superimposing grayscale of all subframe images in the imaging period corresponding to each of the micromirror units in the digital micromirror device, so as to generate the digital mask pattern.

8. The method of manufacturing the grating structure according to claim 1, wherein forming the photosensitive material layer on the substrate comprises:

forming the photosensitive material layer by coating a photosensitive resin material on the substrate.

9. A grating structure for a naked-eye three dimension (3D) display, manufactured with the method of manufacturing the grating structure for the naked-eye 3D display according to claim 1.

10. A method of manufacturing a grating structure for a naked-eye three dimension (3D) display, comprising:

forming a photosensitive material layer on a substrate;

patterning the photosensitive material layer to form a grating transition pattern, wherein the grating transition pattern comprises a plurality of grating units, the plurality of grating units each comprises a first portion and a second portion, the first portion and the second portion are symmetric and directly contacted with each other, and each of the first portion and the second portion comprises a plurality of subunits to have a stepped structure;

wherein the patterning the photosensitive material layer to form the grating transition pattern comprises:

manufacturing the plurality of subunits of the grating unit with a digital photolithography technology without using a physical mask; and the method further comprises:

curing the grating transition pattern to cause a transition from the grating transition pattern to the grating structure for the naked-eye 3D display, comprising:

placing the grating transition pattern in an environment having a temperature in a range of 100 to 250 degrees Celsius for about 1 hour, to cause edge angles for the plurality of subunits to become smooth, such that a surface of each of the plurality of grating units facing away from the substrate become smooth to approach an arc shape so as to form the grating structure for the naked-eye 3D display having a plurality of arc-shaped grating units;

wherein an arc-shaped grating unit in the plurality of arc-shaped grating units corresponds to at least one left-eye pixel for displaying a left-eye image and at least one right eye pixel for displaying a right-eye image, such that the left-eye image is enabled to enter a left eye of a viewer, while the right-eye image is enabled to enter a right eye of the viewer.

11. A grating structure for a naked-eye three dimension (3D) display, manufactured with the method of manufacturing the grating structure for the naked-eye 3D display according to claim 10.

12. The method of manufacturing the grating structure according to claim 10, wherein the plurality of subunits in the grating transition pattern comprises a first subunit, a second subunit and a third subunit sequentially arranged in a direction perpendicular to and away from the substrate, the third subunit, which is farthest from the substrate, in each grating unit has a width in a range from 0.35 µm to 0.5 µm in a direction perpendicular to an extension direction of the subunit.

13. The method of manufacturing the grating structure according to claim 12, the third subunit in each grating unit have a thickness in a range from 0.5 µm to 0.9 µm in a direction perpendicular to the substrate, the second subunit in each grating unit have a thickness in a range from 0.6 µm to 0.9 µm in the direction perpendicular to the substrate, the first subunit in each grating unit have a thickness in a range from 0.7 µm to 0.9 µm in the direction perpendicular to the substrate; and the thicknesses of the first subunit, the thicknesses of the second subunit and the thicknesses of the third subunit are successively reduced.

14. A naked-eye three dimension (3D) display device, comprising:

the grating structure according to claim 9, and a display panel;

wherein the display panel comprises a plurality of left-eye pixels for displaying a left-eye image and a plurality of right-eye pixels for displaying a right-eye image, each of the plurality of left-eye pixels is disposed between corresponding two adjacent right-eye pixels of the plurality of right-eye pixels; and the grating structure is disposed on the display panel, such that one of the plurality of arc-shaped grating units of the grating structure are aligned with a corresponding one of the plurality of left-eye pixels and a corresponding one of the plurality of right-eye pixels.

15. A naked-eye three dimension (3D) display device, comprising:

the grating structure according to claim 11, and a display panel;

wherein the display panel comprises a plurality of left-eye pixels for displaying a left-eye image and a plurality of right-eye pixels for displaying a right-eye image, each of the plurality of left-eye pixels is disposed between corresponding two adjacent right-eye pixels of the plurality of right-eye pixels; and the grating structure is disposed on the display panel, such that one of the plurality of arc-shaped grating units of the grating structure are aligned with a corresponding one of the plurality of left-eye pixels and a corresponding one of the plurality of right-eye pixels.

* * * * *